United States Patent
Popescu (10) Patent No.: US 12,339,342 B2
(45) Date of Patent: Jun. 24, 2025

(54) MAGNETIC RESONANCE SYSTEM AND CORRESPONDING METHOD

(71) Applicant: Siemens Healthcare AG, Forchheim (DE)

(72) Inventor: Stefan Popescu, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 92 days.

(21) Appl. No.: 18/206,664

(22) Filed: Jun. 7, 2023

(65) Prior Publication Data
US 2023/0393224 A1 Dec. 7, 2023

(30) Foreign Application Priority Data
Jun. 7, 2022 (EP) .................................. 22177656

(51) Int. Cl.
| | | |
|---|---|---|
| *G01R 33/56* | (2006.01) | |
| *G01R 33/34* | (2006.01) | |
| *G01R 33/383* | (2006.01) | |
| *G01R 33/385* | (2006.01) | |
| *G01R 33/54* | (2006.01) | |
| *G01R 33/563* | (2006.01) | |

(52) U.S. Cl.
CPC . *G01R 33/56341* (2013.01); *G01R 33/34084* (2013.01); *G01R 33/383* (2013.01); *G01R 33/385* (2013.01); *G01R 33/543* (2013.01)

(58) Field of Classification Search
CPC ........ G01R 33/56341; G01R 33/34084; G01R 33/383; G01R 33/385; G01R 33/543; G01R 33/283; G01R 33/307; G01R 33/34007; G01R 33/445; G01R 33/50; G01R 33/48
See application file for complete search history.

(56) References Cited

U.S. PATENT DOCUMENTS

| | | |
|---|---|---|
| 10,823,793 B2 | 11/2020 | Popescu et al. |
| 2014/0306702 A1 | 10/2014 | Lazar et al. |
| 2015/0177343 A1 | 6/2015 | Wald et al. |

(Continued)

FOREIGN PATENT DOCUMENTS

| | | | |
|---|---|---|---|
| WO | 2021184470 A1 | 9/2021 | |
| WO | 2021184471 A1 | 9/2021 | |
| WO | WO-2022038603 A1 * | 2/2022 | ........... A61B 5/0042 |

OTHER PUBLICATIONS

Blumler, Peter, Proposal for permanent magnet system with a constant Gradient mechanically adjustable in direction and strength, Concepts in Mag, Reson. Part B. vol. 46B(1) 41-48 2016 (Year: 2016).*

(Continued)

*Primary Examiner* — G. M. A Hyder
(74) *Attorney, Agent, or Firm* — Banner & Witcoff Ltd.

(57) ABSTRACT

A magnetic resonance system configured to acquire magnetic resonance data of an object in an field-of-view, wherein the magnetic resonance system includes a magnet that is configured such that it creates a gradient field at the field-of-view; a controller configured to cause the magnetic resonance system to utilize the magnet's gradient field for diffusion weighted imaging or mixed contrast imaging; and a unit of one or several RF coils, wherein the RF coils are configured to acquire magnetic resonance data from the object and to support or flexibly attach to the patient body.

16 Claims, 4 Drawing Sheets

(56) References Cited

U.S. PATENT DOCUMENTS

| | | | |
|---|---|---|---|
| 2015/0260809 A1* | 9/2015 | Vidarsson | G01R 33/383 324/319 |
| 2021/0156938 A1 | 5/2021 | Greiser et al. | |
| 2023/0003816 A1* | 1/2023 | Mallett | G01R 33/3808 |
| 2023/0124702 A1 | 4/2023 | Wu et al. | |

OTHER PUBLICATIONS

Xu, L., et. al., "Comparison of Biparametric And Multiparametric MRI In the Diagnosis Of Prostate Cancer", Cancer Imaging vol. 19, Article No. 90 (2019).

Chandrasekar, T., "EAU 2021: Ultra-Fast Biparametric MRI for Prostate Cancer Detection", 2021 European Association of Urology, EAU 2021—Virtual Meeting, Jul. 8-12, 2021.

Caglic, I., et al. "Comparison of Biparametric Versus Multiparametric Prostate MRI for the Detection Of Extracapsular Extension And Seminal Vesicle Invasion In Biopsy Naive Patients", PMID: 34062473 DOI: 10.1016/j.ejrad.2021.109804.

El-Adalany, M., et. al.: "Comparison Between Biparametric And Multiparametric MR imaging of Prostate Imaging Reporting and Data System Version 2.1 in Detection of Prostate Cancer", Egyptian Journal of Radiology and Nuclear Medicine vol. 52, Article No. 68 (2021).

Pan Ziyi et al., "D-T2 Distribution Obtained Using CPMG-only Sequence Compared with Traditional SE-CPMG Sequence on the Single-sided NMR Device", Proc. Intl. Soc. Mag. Reson. Med. 29 (2021), 3104.

Chiragzada S, et al., "Initial Phantom Studies For An Office-Based Low-Field MR System for Prostate Biopsy" Int J Comput Assist Radiol Surg. May 2021;16(5):741-748. doi: 10.1007/s11548-021-02364-7. Epub Apr. 23, 2021. PMID: 33891253; PMCID: PMC8134310.

Nasr, J. et al. "Office-Based, Point-of-Care, Low-Field MRI System to Guide Prostate Interventions: Recent Developments" EMJ Urol. 2021;9[1]:83-90.

Hoque Bhuiyan, E, et al., "Feasibility Of Diffusion Weighting With A Local Inside-Out Nonlinear Gradient Coil For Prostate MRI", Med Phys. 2021; 48: 5804-5818. https://doi.org/10.1002/mp.15100.

Hoult Di, et al., "The Signal-To-Noise Ratio of The Nuclear Magnetic Resonance Experiment." in Journal of Magnetic Resonance, vol. 24, Issue 1, 1976, pp. 71-85, ISSN 0022-2364, https://doi.org/10.1016/0022-2364(76)90233-X.

Macovski A., "Noise in MRI" in Magn Reson Med. Sep. 1996; 36(3):494-497. doi: 10.1002/mrm.1910360327. PMID: 8875425.).

* cited by examiner

MAGNETIC RESONANCE SYSTEM AND CORRESPONDING METHOD

TECHNICAL FIELD

The disclosure relates to a magnetic resonance system, a unit of one or several RF coils, and a method of acquiring mixed contrast magnetic resonance data.

BACKGROUND

In the case of various diseases, for example prostate cancer, an early detection can significantly improve the chances of a successful therapy and/or the chance to avoid or minimize possible post-treatment sequelae and secondary disorders. For example, a common prostate cancer screening method is a targeted clinical test that measures a prostate specific antigen (PSA) level in the patient blood. This method has the advantages of being relatively cheap and that it may be carried out at the point-of-care (POC), such as a physician's office. However, the PSA results tend to have poor specificity and the PSA test will not find all prostate cancers.

Hence, to detect clinically significant prostate cancers, additional medical examinations are required. For example, the current state of the art involves using tissue biopsies guided by either ultrasound or magnetic resonance imaging. An ultrasound-guided biopsy is relatively cheap and widely available. However, they often have poor tissue contrasts and a high risk of missing prostate tumors. In contrast, magnetic resonance imaging is typically more reliable and precise.

Previous solutions have attempted to provide nuclear magnetic resonance (NMR) measurements at the POC by compressing the hardware of a full body magnetic resonance (MR) scanner into a more compact size. However, this approach poses new problems, since state-of-the-art magnetic resonance imaging (MRI) techniques require high-field magnets to achieve good signal-to-noise ratio, strong gradient coils for diffusion-weighted contrast, as well as a highly homogeneous magnetic field and linear gradients across the field-of-view (FOV) to prevent image artefacts. All these requirements increase the costs, complexity, and installation footprint (e.g. due to large stray magnetic field of strong magnets), while also increasing the operational costs (e.g. due to power & cooling water consumption). Consequently, these requirements prevent a wide deployment at POC of these otherwise very valuable medical devices. Accordingly, current solutions that include magnetic resonance imaging tend to be expensive and not to be readily available at a POC office.

SUMMARY

It is therefore an object of the disclosed subject matter to provide an MR system that is small in size, has low maintenance costs, and can be readily supplied at a point of care. It is a further object of the disclosed subject matter to provide an MR system that can provide NMR data of the pelvis and in particular the prostate.

According to a first aspect of the disclosure, a magnetic resonance system configured to acquire magnetic resonance data of an object in an field-of-view is provided, wherein the magnetic resonance system comprises a magnet, in particular a permanent magnet, that is configured such that it creates a gradient field, which is a static magnetic field having a gradient in its field strength at the field-of-view;

a unit of one or several RF coils, the unit in particular comprising an array of RF coils, wherein the RF coils are configured to generate RF pulses and to acquire magnetic resonance data from the object;

a control unit configured to cause the magnetic resonance system to utilize the magnet's gradient field for diffusion weighted and optionally T2-weighted NMR measurements and/or for spatial encoding of the magnetic resonance data.

The magnetic resonance (MR) system may be a magnetic resonance imaging system, though it may also be used for NMR measurements from a single voxel or from the whole field-of-view. The object being examined may be an organ and/or part of a patient, such as the pelvis or liver region. For example, the object may be a prostate. The field-of-view is preferably a region, where the object is located during an MR examination, and the MR system is configured to acquire MR data from within this region. The field-of-view may be a region with a sufficiently high static magnetic field generated by the magnet, as well as a gradient of sufficient magnitude and homogeneity to carry out NMR measurements, in particular diffusion-weighted measurements. Additionally, the unit of RF coils may be adapted to support and/or flexibly attach to the patient body.

The magnetic resonance system may comprise a positioning element, such as a seat or a patient table, that is configured to guide the patient's position so that the object is located in the field-of-view during the examination. Positioning guidance may, for example, be provided by the geometry of the positioning element.

The magnet is preferably a permanent magnet. To minimize the overall costs, the MR system may use a relatively small magnet, about the same size or smaller than the body part being investigated. In cases where the object is the prostate, the magnet may for example be in at least one extension smaller than the overall size of the pelvis region. For example, the magnet may have a longest extension of 5 to 30 cm, and preferably 8 to 20 cm. The MR system is specifically designed as a single-sided NMR device, wherein the static magnetic field required for NMR measurements is generated by a magnet on one side of the field-of-view.

The magnet is configured to generate a magnetic field at the field-of-view, which has an essentially linear gradient in its field strength in at least one direction. The at least one direction may be directed from the magnet to the field-of-view and/or through the field-of-view. The at least one direction may be orthogonal to the magnet's surface, particularly the surface that faces the field-of-view. The gradient field may be focused on the field-of-view. The magnet may provide a strong inhomogeneity along a direction orthogonal to the magnet surface. Therewith the static gradient in the magnetic field may generate a diffusion contrast. The direction of the magnetic field at the field-of-view may be the same or a different direction from the direction of the gradient. It may also be parallel to the surface of the magnet.

The magnet's geometric shape could enable the creation of the gradient field. Specifically, the magnet may have a curved shape on a side that faces the field-of-view, in particular, such that the magnet has a concave shape with respect to the field-of-view. In other words, the surface of the magnet facing the field-of-view may be curved such that the magnet partially surrounds the field-of-view. A focus point of the curved surface of the magnet may be located on a straight line from the center of the magnet and/or the center of the curved surface to the field-of-view. The focus point may in particular be located in the field-of-view and/or in the area of the field-of-view.

According to an aspect, the MR system may comprise a displacement element configured to displace the magnet in two non-parallel directions. The displacement may be such that the gradient field remains at the field-of-view, with at least one portion of the gradient field remaining at the same location, particularly within the field-of-view, when the magnet is displaced in any or both of two orthogonal directions. Preferably, the direction of the magnetic field gradient changes when the magnet is displaced. As a result, the MR system can generate gradient fields with varying directions of the magnetic field gradient without gradient coils. For example, when the displacement element positions the magnet to three different locations, diffusion-weighted NMR may be carried out to achieve noncollinear and independent diffusion directions for the DWI contrasts. This allows the MR system to detect diffusion within the object in several independent directions. By means of the displacement element, the magnet is movable, preferably along two orthogonal directions, while remaining focused onto the target anatomy, i.e., the object.

The displacement element may be configured to displace the magnet along a trajectory, preferably be a curved trajectory. The trajectory may extend in two dimensions, enabling the magnet to be displaced on a surface. The displacement element may be configured to displace the magnet across a bidimensional curved surface trajectory. The trajectory may extend from −45° to +45° in the left-right direction and −30° to +90° in the sagittal plane, in relation to the patient to be examined. Optionally, the displacement element may be configured to rotate the magnet, providing greater flexibility in adjusting the direction of the gradient field.

The control unit may be a processing unit, such as a CPU, a GPU, a computer, or part of a computer. The computer may be a PC, a server, and/or a console of the magnetic resonance system. It may also be a mobile device, such as a laptop, tablet computer, or mobile phone. The control unit is in particular configured to cause the magnetic resonance system to utilize the magnet's gradient field for magnetic resonance measurements. Preferably, the control unit and/or the system may be configured to use the gradient field both as main magnetic field, Bo, and as gradient field, G. In other words, the control unit and/or the magnetic resonance system do not require an additional gradient coil arrangement and/or an additional main magnet. Hence, the magnetic resonance system might not comprise a separate main magnet and/or separate gradient coil arrangement, making it less complex and/or less expensive. Furthermore, the system may require less space, making it more suitable for the use in a point-of-care office.

Diffusion weighted imaging (DWI) generates contrast in magnetic resonance imaging through the diffusion of molecules. Generally, a diffusion-weighting gradient field is applied during a spin-echo sequence to generate diffusion contrast, causing the signal to be attenuated for spins that have moved in the direction of the diffusion-weighting gradient during the echo time. By changing the direction of the diffusion-weighting gradient field, the preferred direction of diffusion can also be detected. In DWI, each voxel may be assigned an apparent diffusion coefficient (ADC) and a preferred direction of diffusion. Thus, the system, and particularly the control unit, may be adapted to displace the magnet during an NMR measurement session, whether the object/patient is positioned in the field-of-view or in between data acquisitions. The displacement may be carried out in between NMR sequences or during a sequence, as explained in more detail below.

T2-weighted imaging may employ a CPMG (Carr-Purcell-Meiboom-Gill) pulse train magnetic resonance sequence. This sequence uses a train of refocusing 180° RF pulses to acquire an echo train which decays essentially at T2.

Mixed contrast imaging is in particular a combination of T2-weighted contrast and diffusion weighted contrasts. Preferably the T2-weighted contrast and the diffusion weighted contrast are acquired in a single magnetic resonance sequence. This may be achieved by using a CPMG (Carr-Purcell-Meiboom-Gill) pulse train magnetic resonance measuring sequence, or a SE-CPMG sequence.

Diffusion-weighting and T2-weighting may also be applied in single-voxel NMR experiments, for example a diffusion coefficient and T2 may be determined in a bi-parametric magnetic resonance measurement. It has been found that such a bi-parametric NMR measurement can detect prostate cancers, particularly clinically significant prostate cancers. Therefore, diffusion-weighting contrast and T2-contrast are especially useful in MR examinations of the pelvis and screening for prostate cancer.

The disclosed MR system may be adapted to acquire diffusion-weighted and optionally T2-weighted NMR data, as well as mixed contrast NMR data comprising diffusion-weighted and T2-weighted data, in particular separately to provide bi-parametric data. The MR system may be further adapted to acquire NMR data from a single voxel within the field-of-view, including bi-parametric NMR measurements providing only a diffusion coefficient and T2. Corresponding sequences are, for example, described in Ziyi Pan et al. "D-$T_2$ Distribution Obtained Using CPMG-only Sequence Compared with Traditional SE-CPMG Sequence on the Single-sided NMR Device", Proc. Intl. Soc. Mag. Reson. Med. 29 (2021), 3104. The MR system may also be used to carry out MR imaging to acquire MR image data from the field-of-view, in particular DWI and/or T2-weighted imaging. Corresponding sequences are, for example, described in the international publications WO 2021/184470 A1 and WO 2021/184471 A1. The above-mentioned sequences may be adapted for the MR system of the disclosure. For example, the sequences disclosed in Siyi Pan et al. may be carried out several times with different gradient directions, for example 3 to 6 independent gradient directions, each repetition with the magnet in a different displacement position and/or orientation. The independent gradient directions may be noncollinear, and may be at least approximately orthogonal to one another. Diffusion coefficients may thereby be obtained not only in one direction, but in 3 to 6 or more than 6 directions. The diffusion coefficient may thus be a tensor. The disclosed MR system may be adapted to carry out scanning sequences which incorporate displacements/movements of the magnet during the sequence. For example, the sequence may include scanning or data acquisition while the magnet is being moved. The sequence may also include displacing the magnet in between several data acquisitions. It may thus be possible to include spatial encoding into the sequence, and/or to measure the apparent diffusion coefficient in several directions. When moving the magnet during the data acquisition, it may be required to include a correction of motion artefacts caused by said movement.

The unit of one or several RF coils is configured to acquire magnetic resonance data from the object within the field-of-view. Additionally and/or alternatively, the unit may be configured to generate RF pulses in order to excite spins in the object, particularly during an acquisition sequence. The unit may be constructed as an array of RF coils-. The RF coils may comprise RF receive coils and/or RF transmit coils and/or transmit-receive coils. Each of the RF coils may have at least one loop element, preferably multiple loop elements. The system and/or the control unit may be configured to operate each loop element of the RF coil array in transmit (TX) and/or receive (RX) mode, and to use the sensitivity profiles of the individual loop elements to dynamically focus the unit of RF coils on the field-of-view and/or the object.

According to an aspect, the gradient field in the field-of-view may have linearly decreasing field strength with respect to the spatial distance to the magnet, with a preferred linearity better than 10%, preferably better than 5%, and more preferably better than 1%. The linear decrease may be along a direction orthogonal to a surface of the magnet facing the field-of-view. In this context, a linearity "better than 10%" (or 5% or 1%) may in particular mean that the change of field strength deviates by less than 10% of an ideal linear function. A linear decrease of the field strength may reliably generate a diffusion contrast, enabling a constant directional diffusion encoding for magnetic resonance signals to provide a diffusion weighted imaging contrast. The linear decreaselt may further allow implementation of spatial signal encoding from crude to coarse spatial resolution, for example 5 cm$^3$ voxels down to 0.5 cm$^3$ voxels. The linear decrease may in particular provide an essentially constant field gradient. Therein, "essentially" may mean a deviation of less than 10%, preferably less than 5%. It has been found that with a linearity better than 10%, a diffusion weighted imaging contrast can already be achieved with the disclosed system. A linearity of better than 5% may provide a less crude spatial resolution which can be beneficial for some applications. A linearity better than 1% may even allow magnetic resonance imaging with relatively small voxel sizes, e.g. down to 0.5cm$^3$.

According to an aspect the magnet comprises, in particular consists of, multiple small magnet pieces that are arranged together to form the magnet. The small magnet pieces may be arranged, in particular located and/or tilted, such that they provide a targeted spatial distribution of a magnetic field, in particular the gradient field. In this context, "small" may in particular mean that the magnet pieces are smaller than the magnet itself, in particular 5 to 50 times, preferably 10 to 30 times smaller than the magnet. The small magnet pieces may be small magnetic blocks. The small magnet pieces may be arranged according to a calculation, in particular carried out via a genetic algorithm. Advantageously, the small magnet pieces may allow to provide a particularly precise arrangement of the gradient field as required for the disclosed application and/or as required for specific aspects of the disclosed MR system, for example, for specific applications of the system.

According to an aspect, the magnetic resonance system comprises a displacement element configured to displace the magnet, in particular in two non-parallel directions. The two non-parallel directions may be mutually orthogonal. In this context, one or both of the directions may follow a curved trajectory. Preferably, both trajectories are orthogonal to each other at any point. This displacement enables the generation of various different gradient fields by changing the position of the magnet. Hence the displacement element may eliminate the need for a gradient coil and thus further reduce the costs of the system.

The displacement element may be a mechanical displacement element. In an aspect, the displacement element may be a shuttle-like element guided by a guiding structure. The guiding structure may for example be rail-like. For example, the magnet may be mounted on a carriage which is moveable along a guiding structure, in particular rails, which are arranged on a curved surface. The magnet may also be displaced by means of a cable mechanism. The displacement of the magnet may be caused by an actuator, for example by one or several electromotors, which are controlled by the control unit.

The frequency of the magnetic resonance signals from the field-of-view may correlate with the local field strength by the gyromagnetic constant:

$$\omega(x,y,z)=\gamma \cdot |B(x,y,z)|$$

The control unit may be configured to decompose the magnetic resonance signals into small frequency bands corresponding to regions of the magnetic field, in particular to regions having the magnetic field corresponding to the frequency band. Preferably, the strength of the magnetic field may be almost constant within the frequency bands. "Almost constant" may mean a deviation of no more than within 5%, preferably 2%, more preferably 1%. The frequency bands may be curvilinear projections throughout the measurement volume, which may be larger than the field-of-view, and/or throughout the field-of-view. It has been found that it is possible to generate curvilinear projections throughout the measurement volume in a similar way to the generation of fan-beam projections in CT (computer tomography) X-ray imaging. By also using the focusing capability of the unit of RF coils, in particular an RF coil, to focus the MR excitation to a region within the measurement volume or the field-of-view, in particular comprising an RF coil array, it may thus be possible to generate MR images of the object. Therefore, it is possible to generate curvilinear projections throughout the measurement volume by decomposing the NMR signals into small frequency bands corresponding to the magnetic field regions where the strength of the magnetic field is almost constant. In combination with the focusing capability of the RF coil array, this makes possible to generate crude MR images of the field-of-view and/or a measurement volume surrounding the field-of-view. "Crude" in this context may mean that the spatial resolution of the MR image is 0.5 cm$^3$ to 7 cm$^3$. In an aspect, such curvilinear projections may be acquired in at least three nonparallel directions by moving the magnet by the displacement element into three different positions and repeating the same NMR sequence. The data acquired from the at least three magnet positions may also be reconstructed together to form a complete image. Since each acquisition corresponds to a projection, the reconstruction may be performed using a back-projection algorithm, such as a filtered back-projection, as used for the reconstruction of CT images.

The displacement element and/or the control unit may be configured to allow for a moving "sweet spot" within a restricted sensitivity or measurement volume, enabling guided tissue sampling using the magnetic resonance system (e.g., for virtual biopsies). In this context, unique signature of magnetic resonance signals may be analyzed. The magnetic resonance signals may emerge out of dedicated tissue voxel, such as a 0.5 cm$^3$ to 2 cm$^3$ voxel. Signals from this voxel may, for example, be modulated by various encoding patterns (including RF modulation) and may be processed to extract significant clinical information.

According to an aspect, the trajectory of the magnet, in particular two orthogonal directions, span an area that is bowl-shaped. Advantageously, a bowl-shaped trajectory may allow a particularly efficient focusing of the gradient field on the field-of-view and/or on the object to be examined.

According to an aspect, the system is configured to displace the magnet, in particular during a diffusion weighted imaging or single-voxel sequence, such that multiple gradient field directions, in particular six gradient field directions, are created during a measurement sequence. Multiple gradient field directions allow to take full advantage of the diffusion contrast. Multiple directions may allow to assign a three-dimensional direction of diffusion to each voxel as well as additional information such as a rate of diffusion. The multiple gradient field directions may preferably be non-parallel with respect to each other. In particular, the control unit and/or the displacement element may be configured to create at least six noncollinear gradient field directions via displacement of the magnet. Advantageously the system does therefore not require dynamic gradient coils to encode the diffusion directions. Instead, the system may be configured to mechanically move the magnet with respect to the target anatomy. Six directions may in particular be advantageous to allow an effective measurement of the diffusion tensor. In some circumstances, e.g. when some data are already known from previous measurements, it may be beneficial to use fewer gradient field directions, e.g. to save time during the examination.

According to an aspect, the field strength of the permanent magnet is smaller than 1 Tesla, preferably smaller than 0.3 Tesla, more preferably smaller than 0.1 Tesla, at the field-of-view. Advantageously a small field strength can be achieved already with a relatively small and/or cost-efficient producible magnet. The field strength is preferably higher than 0.01 T, more preferred higher than 0.04 T, in order to allow sufficient SNR at coarse resolution.

According to an aspect, the magnet is smaller than object to be investigated in at least one direction and/or dimension. A small magnet may allow to lower and/or minimize the overall costs of the system. For example, the magnet may be smaller in at least one dimension and/or direction than the overall size of the pelvis region of a patient, wherein in particular inside the pelvis region the prostate is located.

According to an aspect, the system is configured to acquire signals with a coarse resolution, wherein a matrix size of the resolution is smaller than 64×64 pixels and/or smaller than 32×32 pixels and/or wherein a voxel size is greater than 0.5 $cm^3$ and/or greater than 3 $cm^3$, in particular between 3 $cm^3$ and 7 $cm^3$. It has been found that a coarse resolution may allow to acquire sufficient information to allow the guidance of a biopsy, in particular of the prostate. Advantageously, by aiming only at a coarse resolution and by implementing the design of the system as described herein, a smaller magnet and/or a more cost-efficient system may be used.

According to an aspect, the system is configured to provide a magnetic resonance signal from at least one prostate biomarker and/or two magnetic resonance imaging contrasts, in particular T2-weighted and diffusion weighted contrasts. Preferably the system is configured to acquire the T2-weighted and the diffusion weighted contrast by means of a single magnetic resonance sequence. Advantageously, the T2-weighted and the diffusion weighted contrast can be important biomarkers in order to detect prostate cancer, in particular clinically significant prostate cancer. Accordingly, the two magnetic resonance imaging contrasts may increase the sensitivity for disease detection.

According to an aspect, the unit of RF receive coils is configured to carry a human patient's weight, the patient comprising the object, wherein the unit is suspended from a frame, in particular a frame of the magnetic resonance system, wherein the unit of one or several RF coils is in particular a seat or is part of a seat which is adapted for a patient to sit on it during a magnetic resonance examination. The seat may for example be the seat of a chair, in particular an examination chair. In particular, the unit is configured to be strong enough to carry a patient's weight. The unit of one or several RF coils may comprise several parts which are connected together by mechanical joints and/or pivoting articulations. Thereby, the unit of RF coils can adapt to the body part to be examined. The unit of one or several RF coils and/or parts thereof may be attached to springs. The springs may be further attached to the system and/or to a chair of the system. Advantageously, the unit being configured to carry a patient's weight may allow a particularly space-saving solution that may also allow an easy application in a point-of-care office. Furthermore, e.g. in the case of a prostate examination, the RF coils may thus naturally be positioned close to the object to examined and thus allow to maximize the magnitude of the received magnetic resonance signals and therewith the signal-to-noise ratio. Providing springs may additionally allow a flexible adaption to the size and/or shape of a patient body.

According to an aspect, the unit of RF receive coils is flexible such that it can adapt to the geometry of a patient being placed on, in particular sitting on, the unit of receive coils. Advantageously, due to the flexibility, the RF coils may thus come particularly close to the object to be examined. Preferably the RF coils are not extensible. The RF coils not being extensible may allow a more reliable and/or more robust tuning and matching of the RF coils. The unit and/or the RF coils of the unit may be designed such that they adapt to a patient geometry in the region of the object to be examined. In an aspect, the unit of RF receive coils are flexible, so that they come as close as possible to the target anatomy and at the same time are strong enough to support the patient weight.

According to an aspect, the system comprises a camera, in particular a 3D camera, wherein the camera is configured to scan a patient's body, in particular from multiple directions, wherein the system is configured to determine the position of the object to be examined based on the camera's scan. The system and/or the control unit may be configured to create a patient avatar. The camera may be configured to scan the patient from multiple different perspectives in order to create the patient avatar. Alternatively and/or additionally, the system and/or the control unit may be configured to estimate the location of the patient and/or of the object within the patient relative to the position of the magnetic resonance system and/or a coordinate system of the magnetic resonance system. The system and/or the control unit may be configured to calculate the position of the object based on the scanned data of the patient and/or based on the patient avatar. Calculating the position of the object may be further based on reference data related to the position of the object, e.g. a prostate, within a patient's body. Advantageously, there may be no need for a high-resolution magnetic resonance localizer. The camera may be configured to continuously acquire image data, in particular 3D image data, of the patient, in particular in order to allow refining the patient avatar. The control unit and/or the system may be configured to refine the patient avatar based on the continuously acquired image data. The system and/or the control unit may be configured to automatically morph the patient avatar according to the current patient's pose. The system and/or the control unit may be configured to adjust the estimated location of the object based on the morphed patient avatar.

According to a further aspect of the disclosure, a unit of one or several RF receive coils is provided, wherein the unit in particular comprises an array of RF coils, wherein the one or several RF coils are configured to acquire magnetic resonance data from an object and optionally to generate RF pulses, wherein the unit is configured to carry a human patient's weight, the patient comprising the object, wherein the unit is suspended from a frame, in particular a frame of the magnetic resonance system, wherein the unit of one or several receive coils is in particular a seat or is part of a seat which is adapted for a patient to sit on it during a magnetic resonance examination. All features and advantages of the magnetic resonance system may be adapted to the unit and vice versa.

According to an aspect, the unit of RF receive coils is flexible such that it can adapt to the geometry of a patient being placed on, in particular sitting on, the unit of receive coils. Advantageously, the flexibility of the unit may allow for the RF coils to come closer to an object to be examined and/or to allow for a more comfortable sitting experience of the patient.

According to a further aspect of the disclosure, a method for acquiring diffusion-weighted and optionally T2-weighted contrast magnetic resonance data, in particular mixed contrast magnetic resonance data, of an object placed at an field-of-view is provided, wherein in particular the system according to any one of the preceding claims is used, wherein the method comprises the steps:

using a permanent magnet to create a gradient field, in particular a linear gradient field, at the field-of-view in order to create a diffusion contrast and/or to achieve a spatial encoding;

mechanically displacing the magnet to multiple positions, in particular to six different positions, in order to measure diffusion magnetic resonance signals in multiple nonparallel directions;

acquiring magnetic resonance data via RF coils, in particular via a unit of RF receive and/or transmit coils.

The method may in particular used for examining the pelvis area of a patient. All features and advantages of the magnetic resonance system and the unit of one or several RF receive coils may be adapted to the method and vice versa. The unit of one or several RF coils may in particular be the unit as described herein.

According to an aspect, a position of the object is determined via a camera, in particular a 3D camera. According to a preferred aspect, the patient anatomy is scanned by the camera before the patient is placed in the magnetic resonance system for the examination and/or when the patient approaches the magnetic resonance system. The camera may scan a patient's body, in particular from multiple directions and the position of the object to be examined may be determined and/or calculated based on the camera's scan. A patient avatar may be created based on the camera's scan, in particular by scanning the patient from multiple different perspectives. Determining the position of the object may be further based on reference data related to the position of the object, e.g. a prostate, within a patient's body. Image data, in particular 3D image data, of the patient may be acquired continuously, in particular in order to continuously refine the patient avatar. The patient avatar may be automatically morphed according to the current patient's pose. The estimated location of the object may be adjusted based on the morphed patient avatar.

All aspects mentioned herein may be combined with each other. The disclosure is also directing to the use a magnetic resonance system as described herein for carrying out examinations of the human pelvis, in particular for acquiring diffusion-weighted and optionally T2-weighted magnetic resonance data. The use is particular suited to examine the prostate of a patient.

BRIEF DESCRIPTION OF THE DRAWINGS

The accompanying drawings illustrate various exemplary aspects and methods of various aspects of the disclosure.

Similar elements are designated with the same reference numbers in the drawings.

DETAILED DESCRIPTION

Figure 1:
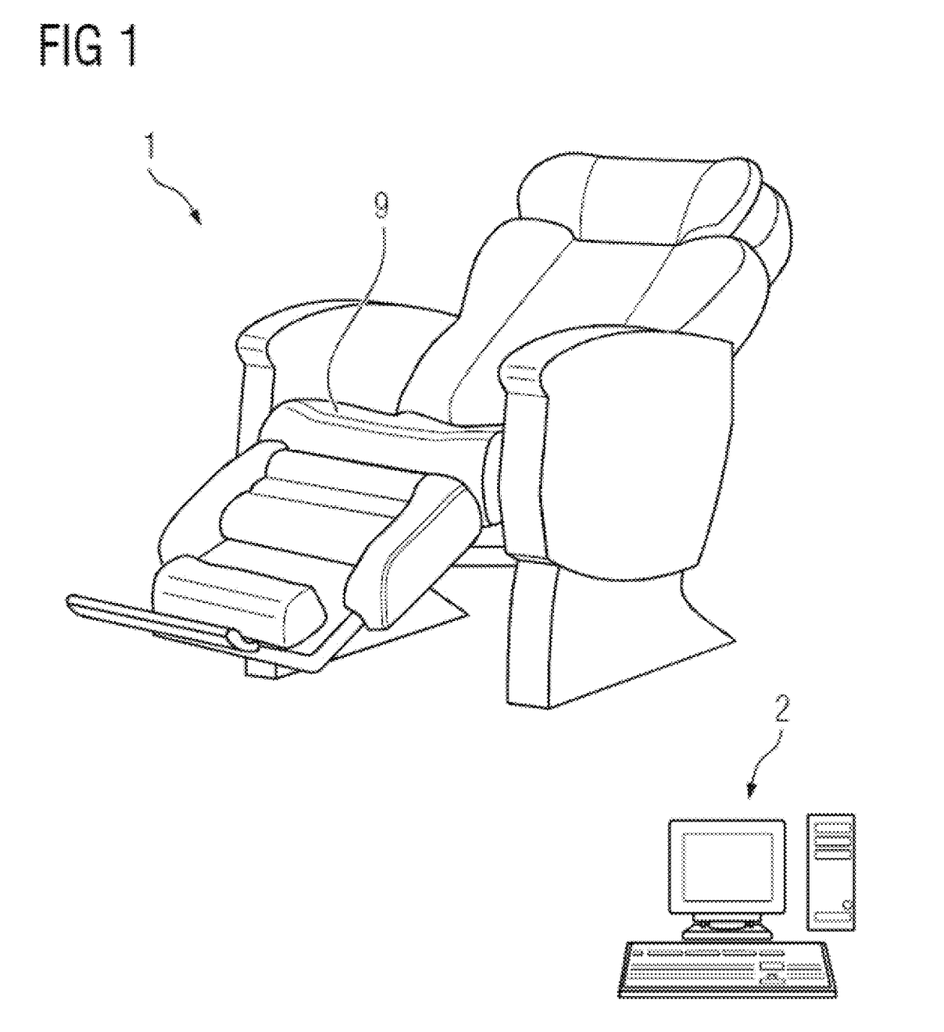
FIG. 1 shows a magnetic resonance system according to an aspect of the disclosure.

FIG. 1 shows a magnetic resonance system 1 according to an aspect of the disclosure. The MR system 1 has the overall dimensions of an armchair and therefore fits easily into a POC office. The magnetic resonance system 1 comprises a control unit 2 that controls displacement of a magnet 3 and a unit of one or several RF coils 6 that is integrated into a seat 9 of the magnetic resonance system 1.

Figure 2:
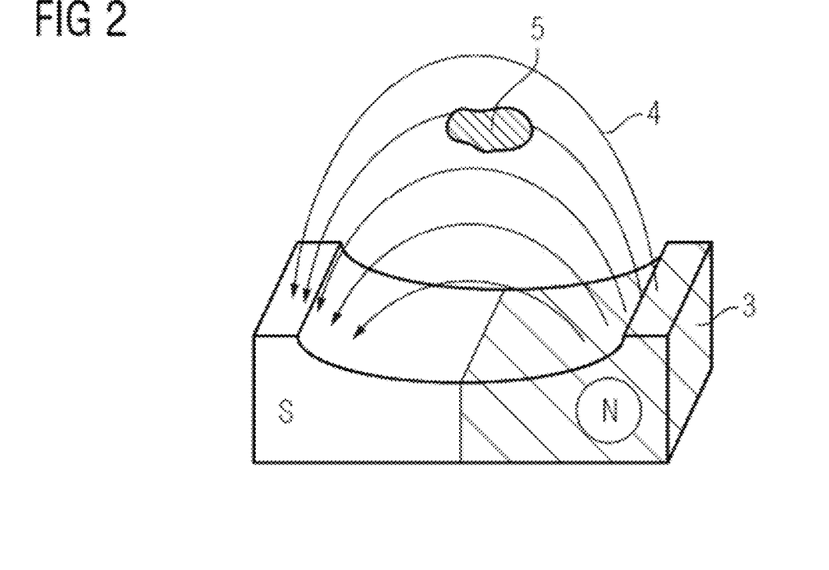
FIG. 2 shows a magnet according to the disclosure.

The geometry of the magnet 3 according to an aspect of the disclosure is shown in FIG. 2. The magnet has a curved surface facing the object 5 to be examined, the object being in the field-of-view of the MR system 1. Magnetic field lines 4 visualize the spatial distribution of the magnetic field created by the magnet 3 in the area of the object 5. Due to the geometry of the magnet, the magnetic field strength in the area of the object 5 decreases linearly with increasing distance to the magnet 3 thereby creating a gradient field at the position of the object 5. The magnet may comprise or consist of multiple small magnet pieces which are assembled according to genetic algorithms that calculate the location and the tilting of these small magnet pieces in order to achieve a targeted spatial distribution of the magnetic field 4. Thus, an essentially constant built-in field gradient orthogonal to the magnet surface may be created, wherein the field strength decreases linearly with the distance to the magnet surface.

Figure 3:
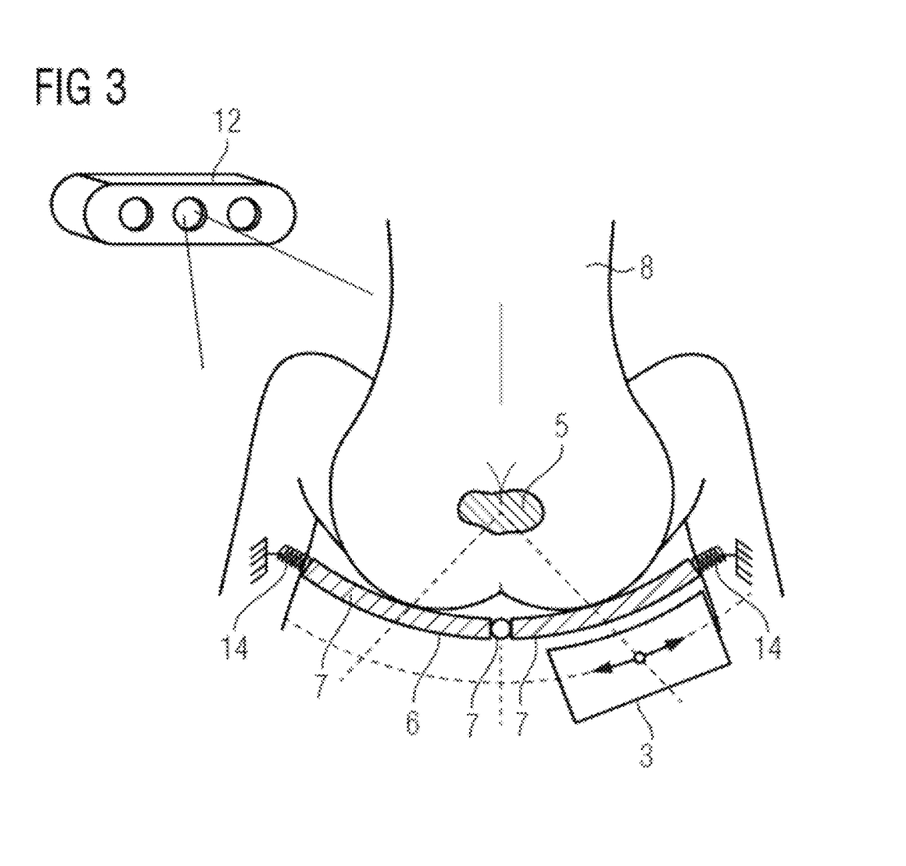
FIG. 3 shows part of a magnetic resonance system according to an aspect of the disclosure.
Figure 4:
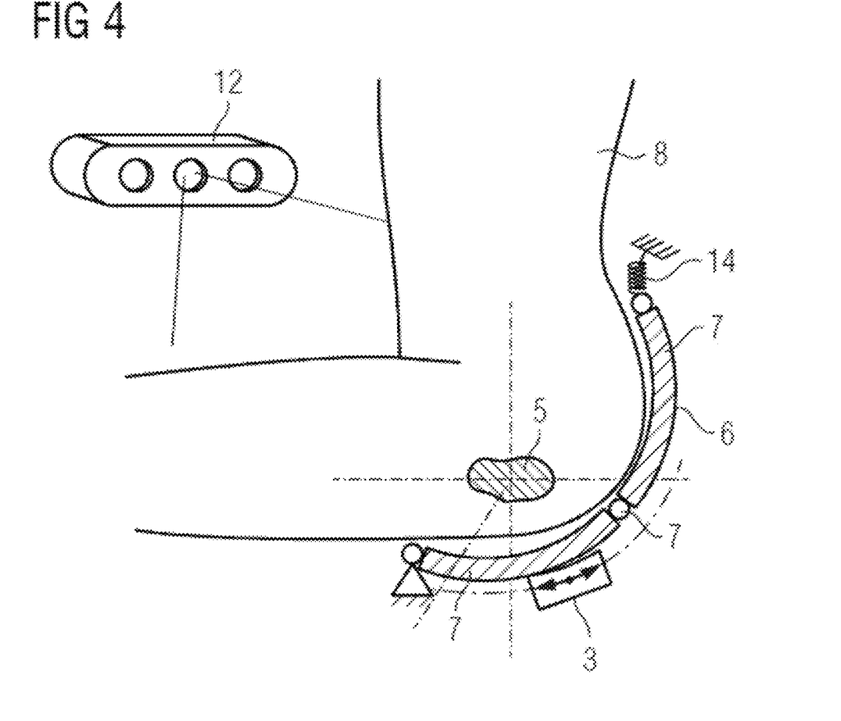
FIG. 4 shows part of a magnetic resonance system according to an aspect of the disclosure.

FIG. 3 shows a part of the magnetic resonance system 3 comprising the magnet 3 and a unit 6 of RF coils 7. The magnet 3 is movable by a displacement element (not shown) as indicated by arrows showing a possible motion trajectory. Preferably the magnet 3 is movable to at least six different, noncollinear positions. In this aspect the magnet 3 can be displaced from left to right spanning an angle from −45° to +45°. FIG. 4 shows a side view of the same set-up as shown in FIG. 3. As indicated by arrows, the magnet can further be displaced along another motion trajectory, namely in the sagittal plane spanning an angle from −30° to +90°.

Due to the movement of the magnet 3 the magnetic field gradient created by the magnet 3 can change its direction at the position of the object 5, for example a prostate of a patient 8. Furthermore, the unit 6 of RF coils 7 serves as a seat for the patient 8 and is suspended via springs 14 to the chair 9. In particular the unit comprises an array RF coils 7 that are flexible. The RF coils 7 may deform and attach closely to the patient 8 in order to maximize the magnitude of received magnetic resonance signals and therewith the signal-to-noise ratio. The RF coils may be connected to each other via mechanical joints. A camera 12, in particular a 3D camera 12, is configured to scan the patient 8 in order to determine the position of the object 5 within the patient 8. The camera 12 scans the patient 8 from multiple perspectives to create patient avatar, in particular a 3D patient avatar. For example, when the patient enters the examination room, the camera 12 continuously acquires views, in particular 3D views, of the patient 8 and the control unit 2 interactively refines the patient avatar. When the patient finally reaches the field-of-view, the avatar is morphed according to the patient pose and the relative location of the object 5 is calculated.

Figure 5:
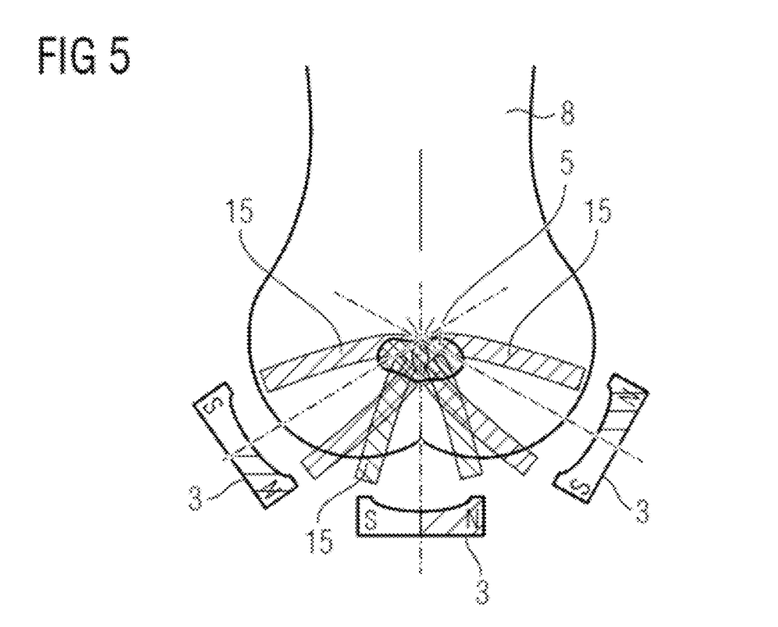
FIG. 5 shows part of a magnetic resonance system with different magnet positions according to an aspect of the disclosure.

FIG. 5 shows three different exemplary positions the magnet 3 may be in during an examination allowing to achieve noncollinear and independent diffusion directions for diffusion weighted imaging contrasts. According to the three different positions of the magnet 3, three different magnetic field regions 15 are measured corresponding to three narrow frequency bands, since the frequency of the local NMR signals correlates with the local field strength by the gyromagnetic constant as $\omega(x, y, z)=\gamma \cdot |B(x, y, z)|$. By decomposing the magnetic resonance signals into small frequency bands that corresponds to the magnetic field regions 15, in which the strength of the magnetic field is almost constant, it is possible to generate curvilinear projections throughout the measurement volume. Together with the positioning of the magnet 3, this enables to reconstruct magnetic resonance images of the object 5.

Figure 6:
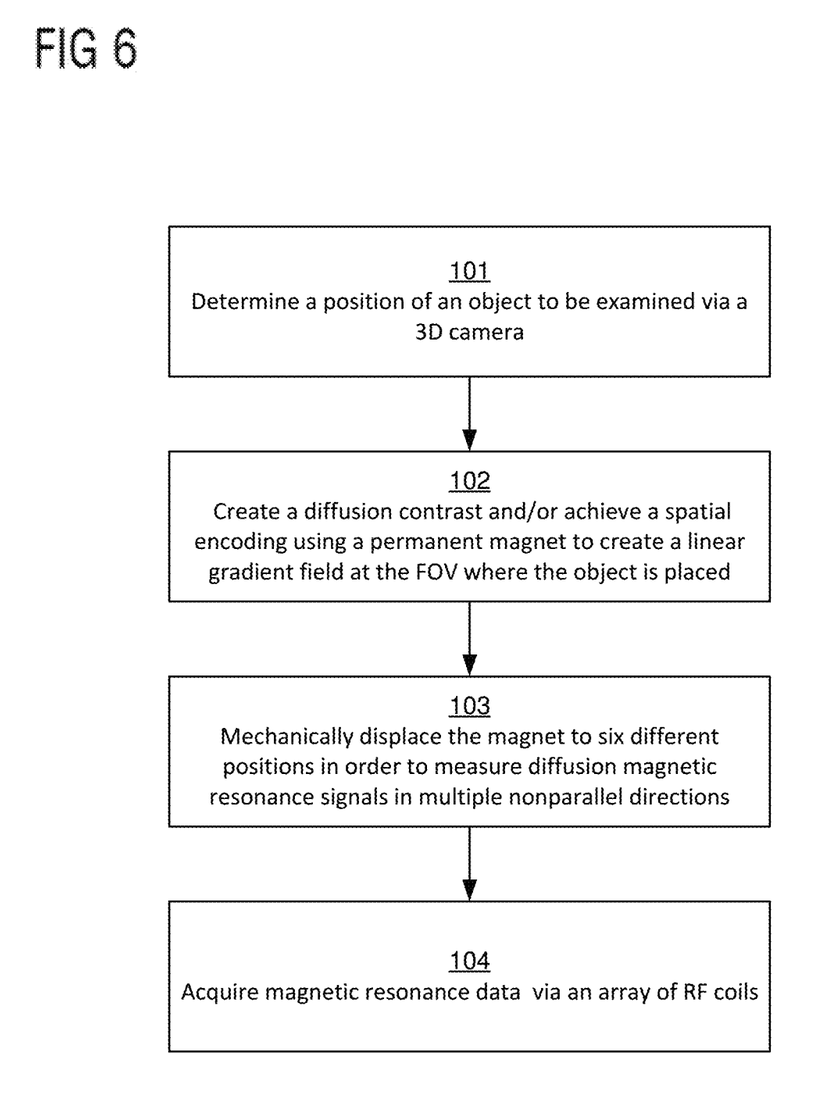
FIG. 6 shows a flow diagram of a method according to an aspect of the disclosure.

FIG. 6 shows a flow diagram of the method according to an aspect of the disclosure. In a first step 101, a position of an object 5 to be examined, for example a prostate, is determined via a camera 12, in particular a 3D camera. For this purpose, a patient 8 anatomy is scanned by the camera 12 before the patient 8 is placed in the magnetic resonance system 1 for the examination and/or when the patient 8 approaches the magnetic resonance system. In the following step 102, a permanent magnet 3 is used to create a linear gradient field at the field-of-view where the object 5 is placed in order to create a diffusion contrast and/or to achieve a spatial encoding. In a further step 103, the magnet 3 is mechanically displaced to six different positions in order to measure diffusion magnetic resonance signals in multiple nonparallel directions. In yet a further step 104, magnetic resonance data are acquired via an array of RF coils 7.

The invention claimed is:

1. A magnetic resonance system configured to acquire magnetic resonance data of an object in a field-of-view, wherein the magnetic resonance system comprises:
    a magnet, that is configured such that it creates a gradient field, which is a static magnetic field having a gradient in its field strength at the field-of-view;
    a unit of one or several radio frequency (RF) coils, wherein the unit is configured to generate RF pulses, to acquire magnetic resonance data from the object, and to carry a human patient's weight, the human patient comprising the object, and wherein the unit is suspended from a frame of the magnetic resonance system, and is a seat or is part of a seat which is adapted for the human patient to sit on it during a magnetic resonance examination; and
    a controller configured to cause the magnetic resonance system to utilize the magnet's gradient field for diffusion weighted or T2-weighted nuclear magnetic resonance (NMR) measurements or for spatial encoding of the magnetic resonance data.

2. The magnetic resonance system according to claim 1, wherein the field strength of the gradient field in the field-of-view decreases linearly with a spatial distance to the magnet, with a linearity better than 10%.

3. The magnetic resonance system according to claim 2, wherein the field strength of the gradient field in the field-of-view decreases linearly with a spatial distance to the magnet, with a linearity better than 1%.

4. The magnetic resonance system according to claim 1, wherein the magnetic resonance system comprises a displacement element configured to displace the magnet in two orthogonal directions.

5. The magnetic resonance system according to claim 4, wherein the displacement element is configured to displace the magnet on a trajectory such that the gradient field remains at the field-of-view such that at least one portion of the gradient field remains at the same location when the magnet is displaced in any or both of the two orthogonal directions, and such that the direction of the gradient field changes when the magnet is displaced.

6. The magnetic resonance system according to claim 5, wherein the trajectory of the magnet span an area that is bowl-shaped.

7. The magnetic resonance system according to claim 4, wherein the system is configured to displace the magnet such that a plurality of gradient field directions are created during a session.

8. The magnetic resonance system according to claim 1, wherein the field strength of the magnet is smaller than 1 Tesla at an area of the object to be examined.

9. The magnetic resonance system according to claim 8, wherein the field strength of the magnet is smaller than 0.1 Tesla at an area of the object to be examined.

10. The magnetic resonance system according to claim 1, wherein the system is configured to provide a magnetic resonance signal from at least one prostate biomarker or two magnetic resonance imaging contrasts that are T2-weighted and diffusion weighted contrasts.

11. The magnetic resonance system according to claim 1, wherein:
    the system comprises a camera,
    the camera is configured to scan a patient's body, and
    the system is configured to determine a position of the object to be examined based on the camera's scan.

12. A method for acquiring diffusion-weighted and T2-weighted magnetic resonance mixed-contrast data, of an object placed at a field-of-view, wherein using the magnetic resonance system according to claim 1, the method comprises:
    using a magnet to create a linear gradient field, at the field-of-view in order to create a diffusion contrast or to achieve a spatial encoding;
    mechanically displacing the magnet to six different positions, in order to measure diffusion magnetic resonance signals in multiple nonparallel directions; and
    acquiring magnetic resonance data via a unit of one or several RF coils.

13. The method according to claim 12,
wherein a position of the object is determined via a camera.

14. The method according to claim 13,
wherein patient anatomy is scanned by the camera before the patient is placed in the magnetic resonance system for an examination or when the patient approaches the magnetic resonance system.

15. A magnetic resonance system configured to acquire magnetic resonance data of an object in a field-of-view, wherein the magnetic resonance system comprises;
 a magnet, which is configured such that it creates a gradient field, which is a static magnetic field having a gradient in its field strength at the field-of-view;
 a unit of one or several radio frequency (RF) coils, wherein the RF coils are configured to generate RF pulses and to acquire magnetic resonance data from the object,
 wherein the unit of RF one or several coils is flexible such that it can adapt to a geometry of a patient sitting on the unit of one or several RF coils; and
 a controller configured to cause the magnetic resonance system to utilize the magnet's gradient field for diffusion weighted or T2-weighted nuclear magnetic resonance (NMR) measurements or for spatial encoding of the magnetic resonance data.

16. A unit of one or several RF coils, wherein:
the one or several RF coils are configured to generate RF pulses or to acquire magnetic resonance data from an object,
the unit is configured to carry a human patient's weight, the patient comprising the object,
the unit is suspended from a frame of a magnetic resonance system, and
the unit of one or several RF coils is a seat or is part of a seat which is adapted for a patient to sit on it during a magnetic resonance examination.

* * * * *